United States Patent Office 3,046,127

Patented July 24, 1962

3,046,127

PHOTOPOLYMERIZABLE COMPOSITIONS, ELEMENTS AND PROCESSES

Arthur Livingston Barney, Vaughn Arthur Engelhardt, and Louis Plambeck, Jr., Wilmington, Del., assignors to E. I. du Pont de Nemours and Company, Wilmington, Del., a corporation of Delaware No Drawing. Filed Oct. 7, 1957, Ser. No. 688,444
9 Claims. (Cl. 96—35)

This invention relates to photopolymerizable compositions, elements and processes of photopolymerization. More particularly, it relates to such compositions, elements and processes which contain certain polynuclear quinones as addition polymerization initiators and certain ethylenically unsaturated compounds capable of forming high polymers by photoinitiated polymerization. The invention also relates to a process for making printing reliefs from such compositions and elements.

The photopolymerization of ethylenically unsaturated compounds is a highly developed art and many initiators for increasing the speed of such polymerization are known. The most practical of these initiators are the vicinal polyketaldonyl compounds of U.S. 2,367,660, e.g., diacetyl, benzil, etc., the α-carbonyl alcohols of U.S. 2,367,661 and U.S. 2,367,670, such as benzoin, pivaloin, etc.; the acyloin ethers of U.S. 2,448,828, such as benzoin methyl or ethyl ethers, etc.; the α-hydrocarbon-substituted aromatic acyloins of U.S. 2,722,512, e.g., α-methyl-, α-allyl-, α-phenylbenzoin, etc.

The preparation of high quality photopolymerized relief printing plates using the foregoing initiators has been described in detail in Plambeck U.S. 2,760,863 granted August 28, 1956. Photopolymerizable plates useful in the process are described in Plambeck U.S. 2,791,504. It is important in making these photopolymerizable plates, or in making printing reliefs therefrom, that no significant thermal photopolymerization takes place. Also, the photographic speed of the composition is of considerable importance.

In assignee's copending application, N. T. Notley, Ser. No. 659,772, filed May 17, 1957, now U.S. Patent 2,951,758, issued September 6, 1960, photopolymerizable compounds utilizing acrylate and α-alkacrylate esters of oxyether-interrupted glycols and containing certain polynuclear quinones are disclosed to be advantageous because of their thermal stability and enhanced photographic speed. These compositions can be made by mixing, milling or calendering at relatively high temperatures and extruded or cast into layers under such temperatures with no significant thermally induced addition polymerization taking place. Photopolymerizable plates made from such compositions, moreover, can be converted to photopolymerized relief printing plates readily with only short exposure times being required and without any thermally induced addition polymerization taking place.

An object of this invention is to provide new and useful addition photopolymerizable compositions. Another object is to provide such compositions which are inactive thermally at elevated temperatures, e.g., 80° C. to 200° C., and do not undergo addition polymerization during the preparation of a photopolymerizable plate. Yet another object is to provide such compositions which have inherent thermal stability and good photographic speed. A still further object is to prepare such compositions in the form of thin layers and more particularly to provide photopolymerizable elements containing such layers which can be photopolymerized to an insoluble product in a short period of time. Still further objects will be apparent from the following description of the invention.

The above objects are attained and new and useful photopolymerizable compositions, elements and processes provided in accordance with this invention.

The photopolymerizable compositions of the invention comprise (1) a polynuclear quinone having a carbocyclic ring and two intracyclic carbonyl groups of such ring attached to intracyclic carbon atoms in a conjugated ring and having at least one aromatic carbocyclic ring fused to the ring containing the carbonyl groups as addition photopolymerization initiators, (2) a chain transfer agent of addition polymerization having a molar transfer coefficient between 0.0005 and 1.0 and (3) at least one addition photopolymerizable ethylenically unsaturated compound capable of forming a high polymer by photoinitiated polymerization in the presence of an addition photopolymerization initiator therefor activatable by actinic light, having a molar transfer coefficient no greater than 0.0005 and substantially less than that of the added chain transfer agent. These polymerizable compounds which are normally non-gaseous liquid or solid compounds preferably contain at least one terminal ethylenic group, have a molecular weight less than 1500 and a boiling point higher than 100° C. at normal pressure. The chain transfer agents preferably have a molar transfer coefficient between 0.001 and 0.2 and most preferably a molar transfer coefficient between 0.005 and 0.05.

With regard to the initiators of constituent (1), these polynuclear quinones may be unsubstituted or may have one or more of the hydrogen atoms substituted, e.g., with an alkyl, aryl, or aralkyl group, a halogen, e.g., chlorine, or a carboxylic acid or sulfonic acid group or an alkali metal or ammonium salt of such acid groups.

Suitable alkyl groups which may be present include methyl, ethyl, tert-butyl, propyl, and isopropyl. Alkyl groups on adjacent carbon atoms in the ring structure may be joined to form, with the said adjacent carbon atoms, e.g., a ring of five to seven carbon atoms. Suitable aryl radicals include phenyl, naphthyl, biphenyl, and suitable aralkyl radicals include benzyl, α-phenethyl, and menaphthyl. Substitution by aromatic nitro, amino, and hydroxyl groups is not desirable because these groups, being inhibitory in nature, tend to reduce the usefulness of the polynuclear quinones of the invention. Among the polynuclear quinones which can be used in the photopolymerizable compositions of the invention are 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone β-sulfonic acid, 3-chloro-2-methylanthraquinone, retenequinone, 7,8,9,10-tetrahydronaphthacenequinone, 1,2,3,4-tetrahydrobenz[a]anthracene-7,12-dione.

Constituent (2), namely the chain transfer agent should have a transfer value or activity in a free-radical, addition polymerization reaction at least as high as methanol but less than that of hydroquinone when measured at 60° C. against a polymerizing monomer (vinyl acetate) in a liquid, oxygen-free system under autogenous pressure comprising the transfer agent and a free-radical-generating addition polymerization initiator in solution in the monomer. The chain transfer agents are organic compounds compatible with the initiator and addition polymerizable ethylenically unsaturated compound and preferably have chemically combined oxygen and/or sulfur atoms present in one or more oxyether, oxyhydroxy and/or thioether or mercapto groups. By oxyhydroxy and mercapto groups applicants intend to include the oxycarbonyl and thionocarbonyl substituents reacting in the tautomeric oxyhydroxy and mercapto forms. In order to have the necessary chain transfer activity or coefficient, these preferred transfer agents should have a molecular structure in which the carbon atoms directly linked to the oxygen or sulfur atom of the activating group can be, at the most separately linked to two other carbon atoms, that is, the atoms should preferably be primary or secondary carbon atoms.

An important group of such chain transfer agents are the aliphatic monohydric primary or secondary alcohols of one to six carbon atoms, the alkylene glycols of two to six carbon atoms and the polyglycols containing at least two oxyalkylene groups. An important class of such compounds includes the polyalkylene oxides or glycols having molecular weights from 200 to 8000 or more and their ethers and esters, and also the condensation products of hexitol ring dehydration products with ethylene oxide or propylene oxide containing at least six oxyalkylene groups and having molecular weights from 400 to 8000 or more. Suitable compounds of this type are described in U.S. Patents 2,423,549, 2,441,389, 2,240,472 and 2,400,532.

Another important class of chain transfer agents are the alkyl mercaptans of 4 to 16 carbon atoms, the thioureas and the N-alkenyl and N-alkyl derivatives thereof.

As is apparent from the foregoing description, the chain transfer agent must be carefully chosen as to its chain transfer properties. The same conditions hold true for the addition polymerizable component. It is necessary that the lower limit of transfer activity for the transfer agent be no lower than that for the polymerizable component in question. The most preferred systems, since it is in such systems that the most significant improvements in photographic speed are achieved, involve those polymerizable components or compounds, the transfer coefficients of which are significant orders of magnitude below the transfer coefficient of the activator.

The same conditions hold true for the polynuclear quinone initiator but obviously much less critically in view of the significantly lower concentration of the quinone used which should have little, if any, chain transfer activity and the transfer coefficient therefor should be no higher than that for the polymerizable component. Furthermore, the polynuclear quinone should be free of substituents known to have a high propensity for trapping radicals, particularly radicals involved in the initiation and propagation of addition polymerization of ethylenically unsaturated, addition polymerizable components. Such substituents include nitro and amino groups including mono- and disubstituted amino groups.

The polynuclear quinone initiators should be present in concentrations ranging from the solubility limit thereof in the polymerizable composition, generally not above 2% (although quantities above the solubility limit can be used), down to quantities as low as 0.0001%, based on the polymerizable component. Generally the polynuclear quinone will be present in the composition in concentrations ranging from 0.0001% to 0.2% by weight of the polymerizable component. Preferably the polynuclear quinone will be present in amounts ranging from 0.001% to 0.1% based on the polymerizable component. The chain transfer agent can be present in much larger quantities ranging from as much as 100% by weight based on the polymerizable component down to quantities in the order of 0.01% based on the polymerizable component. The relative quantities of the agent will vary in an inverse relationship with the transfer efficiency thereof.

The novel polymerizable compositions of this invention may contain, in addition to the three main constituents described above, additional materials or adjuvants, e.g., compatible filler materials, including both addition and condensation polymers, addition polymerization inhibitors, pigments, or dyes. The polymerizable component within the broad purview of this invention can comprise from 5 to 100% of these compositions, exclusive of the polynuclear quinone and chain transfer agent. Practically speaking, the polymerizable component which preferably is free of oxyether or hydroxy, or the corresponding sulfur-containing mercapto or thioether linkages will comprise from 10 to 60% by weight of the compositions, exclusive again of the polynuclear quinone and chain transfer agent. The other possibly present components of these compositions, e.g., compatible filler materials, will generally comprise from 40 to 90% by weight of the composition, again exclusive of the polynuclear quinone and chain transfer agent. These compositions can be thoroughly mixed by the aid of any conventional mixing or milling apparatus for plastic materials and formed into a sheet or layer on a suitable support by milling and pressing at elevated temperatures, for instance, at temperatures up to 150° C. for periods up to 20 minutes.

The photopolymerizable elements of this invention comprise a support, e.g., a sheet or plate, and superposed thereon a layer of the above-described photopolymerizable compositions, preferably 3 to 250 mils in thickness, with the relief height-forming stratum thereof being essentially non-light scattering of the actinic light effecting the polymerization.

Suitable base or support materials include metals, e.g., steel and aluminum plates, sheets, and foils, and films or plates composed of various film-forming synthetic resins or high polymers, such as addition polymers, including those mentioned later for use in the photopolymerizable layer and in particular vinylidene polymers, e.g., vinyl chloride polymers, vinylidene chloride copolymers with vinyl chloride, vinyl acetate, or acrylonitrile; and vinyl chloride copolymers with the latter two monomers; linear condensation polymers such as polyesters, e.g., polyethylene terephthalate; polyamides, e.g., polyhexamethylenesebacamide; etc. Fillers or reinforcing agents can be present in the synthetic resin or polymer bases. Suitable such agents include various fibers (synthetic, modified, or natural), e.g., cellulosic fibers for instance, cotton, cellulose acetate, viscose rayon, and paper; glass wool; and nylon. These reinforced bases can be used in laminated form. The adherent support for the photopolymerizable layer can be a contiguous supporting sheet of the photopolymerizable composition when the mechanical properties thereof are suitable.

When highly reflective bases and particularly metal base plates are used, any oblique rays passing through clear areas in the image-bearing transparency will strike the surface of the base at an angle other than 90° and after resultant reflection will cause polymerization in nonimage areas. The degree of unsharpness in the relief progressively increases as the thickness of the desired relief and the duration of the exposure increase. It has been found that this disadvantage can be overcome in carrying out the invention when the photopolymerizable composition is deposited on a base which reflects more than 35% of the incident actinic light, by having an intervening stratum sufficiently absorptive of actinic light so that less than 35% of the incident actinic light is reflected. This light-absorptive stratum must be adherent to both the photopolymerized image and the base material. The photopolymerizable layer itself can serve as the light-absorptive layer.

The light-absorptive layer can be formed directly on the surface of the light-reflective base, for instance, by dyeing in the case of anodized aluminum plates, by "blueing" or chemical blackening such as is obtained with molten dichromate baths in the case of iron or steel plates. In these instances, a separate resin anchor layer adherent to the colored base and the photopolymerizable layer may be applied where necessary. A practical method of supplying the layer absorptive of reflected light, or non-halation layer, is to disperse a finely divided dye, pigment or other compound, which substantially absorbs actinic light, in a solution or aqueous dispersion of a resin or polymer which is adherent to both the support and photopolymerizable layer and coating it on the support to form an anchor layer which is dried.

Printing reliefs can be made in accordance with this invention by exposing to actinic light selected portions of a photopolymerizable layer of an element described above, e.g., through an image-bearing transparency or stencil having areas essentially transparent to actinic light and of substantially uniform density and areas opaque to actinic light and of substantially uniform optical density, until addition polymerization to the desired depth is essentially complete, i.e., to the insoluble state, in the exposed portions or areas with no significant polymerization in the unexposed portions or areas, and removing the unexposed portions of the layer in the areas thereof corresponding to the opaque areas of the transparency or stencil.

The invention is further illustrated by, but is not intended to be limited to, the following examples wherein the parts stated are parts by weight unless otherwise indicated.

*Example I*

A glass reactor was charged with five parts of ethylene dimethacrylate, 0.02 part of 9,10-anthraquinone, and 5.0 parts of a polyethylene glycol having an average molecular weight of 600. The reactor and its contents were then exposed to the radiation from a commercial 275-watt transformerless sunlamp at a distance of eight inches. Polymerization of the ethylene dimethacrylate as evidenced by an increase in viscosity of the charge was noticed after an exposure of 2 minutes, and the polymerization proceeded so rapidly that the charge had gelled after 3 minutes' exposure. In contrast, a similar charge without the added polyethylene glycol required from 20 to 30 minutes for the beginning of polymerization to occur and an exposure of greater than 50 minutes to reach the gel stage. A similar charge without the 9,10-anthraquinone required an exposure of 45 minutes before polymerization occurred, and an exposure of 120 minutes to reach the gel stage. Under similar conditions, the ethylene dimethacrylate alone, i.e., without the added polynuclear quinone initiator and without the activator, required an exposure of greater than 180 minutes before polymerization occurred and an appreciably longer time before the gel stage was reached.

These data are presented in the following table as entries 4, 2, 3 and 1, respectively. The data for the remaining 92 entries in this table were obtained in similar experiments with the indicated variations in the particular monomer, polynuclear quinone initiator, and chain transfer agent or activator. Entries 5–9 show the effect of decreasing concentration of the chain transfer agent over a hundredfold range with the polymerization and gel times decreasing only approximately tenfold. Entries 10–15 show the efficacy of a lower molecular weight glycol as a chain transfer agent, and likewise show the increase in times reflected by a decreasing concentration of the chain transfer agent. Entries 14–17 indicate the extremely high efficiency of the polynuclear quinone initiator since, keeping the concentration of chain transfer agent constant, a drop in the polynuclear quinone concentration by a factor of fourfold increases the polymerization and gel times only slightly. Entries 18–27 show the efficacy of other free hydroxy-containing or ether-containing chain transfer agents. Entries 28–36 show the efficiency of these systems with a different monomer and various different chain transfer agents, while entries 33–36 show the efficiency of different polynuclear quinones. Entries 37–57 show the efficiency of these systems with substituted polynuclear quinones and various sulfur-containing chain transfer agents. Entries 58–78 show the efficiency of these systems with different monomers even when the concentration of the polynuclear quinone is reduced a hundredfold. Entries 79–96 show the specificity of the invention in that: (1) the quinone must the polynuclear, (2) the chain transfer agent must have the required chain transfer efficiency, and (3) the quinone must be free of high chain transfer substituents, such as amine substituents.

| No. | Monomer | Parts | Initiator | Parts | Activator | Start of polymerization (Mins.) | Gel Time (Mins.) |
|---|---|---|---|---|---|---|---|
| 1 | ethylene dimethacrylate | -------- | none- control | -------- | none, control | >180 | did not. |
| 2 | do | 0.02 | 9,10-anthraquinone | -------- | do | 20-30 | >50. |
| 3 | do | -------- | none, control | 5.0 | polyethylene glycol-600 | 45 | 120. |
| 4 | do | 0.02 | 9,10-anthraquinone | 5.0 | do | 2 | 3. |
| 5 | do | 0.02 | do | 2.0 | do | 3.5 | 7. |
| 6 | do | 0.02 | do | 1.0 | do | 6 | 10. |
| 7 | do | 0.02 | do | 0.5 | do | 9 | 11. |
| 8 | do | 0.02 | do | 0.2 | do | 14 | 17. |
| 9 | do | 0.02 | do | 0.05 | do | 20 | 30. |
| 10 | do | 0.02 | do | 5.0 | triethylene glycol | 1 | 2. |
| 11 | do | 0.02 | do | 2.0 | do | 3 | 5. |
| 12 | do | 0.02 | do | 1.0 | do | 4 | 5. |
| 13 | do | 0.02 | do | 0.2 | do | 8 | 9.5. |
| 14 | do | 0.01 | do | 5.0 | do | 2 | 4. |
| 15 | do | 0.01 | do | 1.0 | do | 4.5 | 5.5. |
| 16 | do | 0.005 | do | 5.0 | do | 2.5 | 4. |
| 17 | do | 0.005 | do | 1.0 | do | 5.5 | 6.5. |
| 18 | do | 0.02 | do | 5.0 | glycerine | 10 | 15. |
| 19 | do | 0.02 | do | 0.5 | do | 18 | 18. |
| 20 | do | 0.02 | do | 5.0 | 1,2-propylene glycol | 6 | 8. |
| 21 | do | 0.02 | do | 5.0 | isopropyl alcohol | 5 | 8. |
| 22 | do | 0.02 | do | 5.0 | methyl alcohol | 7 | 10. |
| 23 | do | 0.02 | do | 5.0 | ethyl alcohol | 4 | 12. |
| 24 | do | 0.02 | do | 5.0 | n-propyl alcohol | 12 | 15. |
| 25 | do | 0.02 | do | 5.0 | bis-(2-ethoxyethyl) ether | 5 | 8. |
| 26 | do | 0.02 | do | 5.0 | triethylene glycol diacetate | 5 | 8. |
| 27 | do | 0.02 | do | 0.5 | polyethylene glycol (4000) | 8 | 10. |
| 28 | methyl methacrylate | 0.02 | do | -------- | none, control | >1,080 | |
| 29 | do | 0.02 | do | 5.0 | bis-(2-tehoxyethyl) ether | 90 | >360. |
| 30 | do | 0.02 | do | 5.0 | 1,2-propylene glycol | 10 | 45. |
| 31 | do | 0.02 | do | 5.0 | triethylene glycol | 20 | >240. |
| 32 | do | 0.02 | do | 5.0 | polyethylene glycol-600 | 20 | >240. |
| 33 | do | 0.01 | 2-tert. butyl-9,10-anthraquinone. | -------- | none, control | no polymer in 60 | |
| 34 | do | 0.01 | do | 0.05 | N-allylthiourea | viscous in 30 | |
| 35 | do | 0.01 | do | 0.1 | do | do | |
| 36 | do | 0.01 | do | 0.2 | do | do | |
| 37 | ethylene dimethacrylate | 0.02 | do | 2.0 | triethylene glycol | 4.2 | 6.2. |
| 38 | do | -------- | none, control | 0.1 | dodecyl mercaptan | >30 | |
| 39 | do | 0.01 | 2-tert. butyl-9,10-anthraquinone. | 0.1 | do | 9 | 12. |
| 40 | do | 0.01 | do | 1.0 | triethylene glycol | 3.2 | 6.5. |
| 41 | do | 0.01 | do | 0.1 | 10% dodecylmercaptan-in-cyclohexane. | 6.2 | 12. |

| No. | Monomer | Parts | Initiator | Parts | Activator | Start of polymerization (Mins.) | Gel Time (Mins.) |
|---|---|---|---|---|---|---|---|
| 42 | ethylene dimethacrylate | -------- | none, control | 0.01 | 2-mercaptobenzothiazole | 9.8 | 12. |
| 43 | do | -------- | do | 0.1 | N-allylthiourea | >30 | |
| 44 | do | -------- | do | 0.1 | N - allyl - N' - phenylthiourea. | >30 | |
| 45 | do | 0.02 | 2-tert. butyl-9, 10-anthraquinone. | 0.1 | N-allythiourea | 2.5 | 3.8. |
| 46 | do | 0.01 | do | 0.1 | do | 3.8 | 4.5. |
| 47 | do | 0.002 | do | 0.01 | do | 3.3 | 3.8. |
| 48 | do | 0.002 | do | 0.01 | 2-mercaptobenzo-thiazole | 6.8 | 8. |
| 49 | do | 0.05 | do | 0.1 | N-allyl-N'-phenyl-thiourea. | 1.8 | 2.7. |
| 50 | do | 0.02 | do | 0.1 | tetramethyl thiuram monosulfide. | 5.2 | 6.5. |
| 51 | do | 0.02 | do | 0.1 | thiourea | 8.0 | 11.5. |
| 52 | do | 0.02 | do | 0.1 | N-allyl-N', N'-diethylthiourea. | 2.2 | 3.5. |
| 53 | do | 0.02 | do | 0.1 | di-n-butylsulfide | 3.5 | 5.7. |
| 54 | do | 0.02 | do | 0.1 | N-allyl-N'- (p-methylthiomethylphenyl) thiourea. | 5 | 7. |
| 55 | do | 0.02 | do | 0.1 | N-allyl-N'- (p-ethoxyphenyl) thiourea. | 3.5 | 6.1. |
| 56 | do | 0.02 | do | 0.05 | N, N'-diallylthiourea | 1.5 | 5.5. |
| 57 | do | 0.02 | do | 0.05 | N, N'-dicyclohexyl-thiourea. | 9.3 | 14.5. |
| 58 | tetramethylene diacrylate | 0.2 | do | 0.1 | N-allylthiourea | 0.1 | 12.5. |
| 59 | tetramethylene dimethacrylate | 0.02 | do | -------- | none, control | >30 | |
| 60 | do | 0.02 | do | 0.1 | N-allythiourea | 1.0 | 8.1. |
| 61 | 20% aqueous methacrylamide | 0.02 | sodium 9,10 anthra-quinone-2-sulfonate. | -------- | none, control | no polymer in 30 | |
| 62 | do | 0.02 | do | 2.0 | ethyl alcohol | -------- | 30. |
| 63 | 5% aqueous acrylonitrile | -------- | none, control | 2.0 | triethylene glycol | no polymer in 20 | |
| 64 | do | 0.02 | sodium 9, 10-anthra-quinone-2-sulfonate. | -------- | none, control | do | |
| 65 | do | 0.02 | do | 2.0 | triethylene glycol | 4 | |
| 66 | acrylonitrile | -------- | none, control | 2.0 | do | no polymer in 20 | |
| 67 | do | 0.02 | sodium 9, 10-anthra-quinone-2-sulfonate. | -------- | none, control | 13.5 | |
| 68 | do | 0.02 | do | 2.0 | triethylene glycol | 5.5 | 15. |
| 69 | 20% aqueous methacrylamide | 0.02 | dipotassium 9, 10-anthraquinone 1,8-disulfonate. | -------- | none, control | no polymer in 30 | |
| 70 | do | 0.02 | do | 2.0 | ethyl alcohol | -------- | 30. |
| 71 | methacrylic acid | 0.02 | 9,10-anthraquinone | -------- | none, control | 8.0 | 13.0. |
| 72 | do | 0.02 | do | 2.0 | triethylene glycol | 0.3 | 1.3. |
| 73 | do | -------- | none, control | 2.0 | do | 5.0 | 7.0. |
| 74 | Vinyl acetate | -------- | do | -------- | none, control | no polymer in 150 | |
| 75 | do | 0.002 | 2-tert.butyl-9,10-anthraquinone. | -------- | do | do | |
| 76 | do | -------- | none, control | 0.1 | N-allylthiourea | do | |
| 77 | do | 0.002 | 2-tert.butyl-9,10-anthraquinone. | 0.01 | do | 15% conversion to polymer in 150. | |
| 78 | do | 0.0002 | do | 0.01 | do | 20% conversion to polymer in 150. | |

NEGATIVE RESULTS

| | | | | | | | |
|---|---|---|---|---|---|---|---|
| 79 | Ethylene dimethacrylate | -------- | none, control | -------- | none, control | >180 | |
| 80 | do | 0.02 | 9,10-anthraquinone | -------- | do | 20-30 | >50. |
| 81 | do | 0.02 | do | 5.0 | diethyl phthalate | 25 | very slow—low T. |
| 82 | do | 0.02 | do | 5.0 | acetone | 25 | Do. |
| 83 | do | 0.02 | do | 5.0 | tert. butanol | none | none—low T |
| 84 | do | 0.02 | do | 0.2 | N,N-dimethylaniline | do | none—high T. |
| 85 | do | 0.02 | 2-tert.butyl-9,10-anthraquinone. | 0.1 | hydroquinone | no polymer in 30 | high T. |
| 86 | do | 0.02 | do | 0.1 | tetramethyl thiuramdisulfide. | no polymer in 60 | high T. |
| 87 | do | 0.02 | do | 0.1 | tetraethyl thiruamdisulfide. | 45 | 57 high T. |
| 88 | do | 0.02 | chloranil (mononuclear) | -------- | none, control | no polymer in 60 | |
| 89 | do | 0.02 | chloranil | 5.0 | triethylene glycol | no polymer in 30 | |
| 90 | do | -------- | none, control | -------- | none, control | no polymer in 60 | |
| 91 | do | 0.02 | 9,10-anthraquinone | -------- | do | no polymer in 30 | |
| 92 | do | 0.02 | do | 5.0 | triethylene glycol | 2 | 3. |
| 93 | do | 0.05 | xanthone | -------- | none, control | no polymer in 60 | |
| 94 | do | 0.05 | do | 1.0 | polyethylene glycol 600 | do | |
| 95 | do | 0.05 | bis-(p-dimethyl-aminophenyl)ketone. | -------- | none, control | do | |
| 96 | do | 0.05 | do | -------- | polyethylene glycol 600 | do | |

NOTE.—In items Nos. 81–87 in the above table T stands for molar transfer coefficient.

*Example II*

A cylindrical reactor closed at one end, fabricated from a commercially available high silica glass and approximately 30 diameters in length, was charged with 0.020 part of anthraquinone and with highly purified, carefully deoxygenated, inhibitor-free methyl methacrylate in amount corresponding to 2 parts by volume water (about 1.872 parts). The resultant mixture was flushed with nitrogen for 5 minutes. The glass reactor was then immersed in a solid carbon dioxide/acetone bath until the methyl methacrylate had solidified. The reactor was then evacuated to substantially flat, oil-pump vacuum and finally sealed. The sealed reactor was allowed to warm to room temperature and was then exposed to irradiation emanating from two 15-watt BL-360 fluorescent lamps. An exposure of eight hours under these conditions was necessary to effect gelation of the monomer.

The following table presents this result along with others obtained under identical conditions with the indicated variations in the added chain transfer agent:

| Polynuclear Quinone | Chain Transfer Agent | Gel Time (Hours) |
|---|---|---|
| Anthraquinone | None | 8 |
| None | Dodecyl mercaptan | >8 |
| Anthraquinone | do | 6.5 |
| None | Octyl mercaptan | >8 |
| Anthraquinone | do | 6.5 |
| None | Benzenethiol | >8 |
| Anthraquinone | do | 4 |

Since some polynuclear quinones are highly colored compounds, a choice among the applicable polynuclear quinones will be made depending on the use to which the photopolymerizable compositions are to be put. Ordinarily, the color is of no moment in the very small concentrations which are effective in initiating polymerizations, and in thin layers of polymerizable compositions the color does not appreciably affect light transmission. However, when the compositions are to be used as intermediate layers in safety glass compositions, for example, or as transparent sheets for optical or photographic purposes, quinones giving a yellowish or other tint in the concentrations necessary for photopolymerization will be avoided. On the other hand, when the compositions are to be used in the preparation of photopolymerizable printing plates, where the color of the final product is of little significance, the choice of the quinone will depend on its efficiency.

The invention is generic in applicability to any polymerizable, ethylenically unsaturated component free of oxyhydroxy or oxyether units or the corresponding sulfur, mercapto, or thioether groups, including mixtures of two, three, or more such compounds. Because of their availability and lower cost, terminal monoethylenically unsaturated monomers, i.e., vinylidene monomers, particularly the vinyl monomers, are preferred. These monomers include the vinyl carboxylates or precursors thereto, e.g., those wherein the vinyl group is in the acid portion of the molecule, such as acrylic acid and its esters, e.g., methyl acrylate, ethyl acrylate, n-butyl acrylate; acrylonitrile, methacrylonitrile; the $\alpha$-alkyl acrylates, e.g., methacrylic acid and ethacrylic acid and their esters such as methyl, n-propyl, n-butyl, isopropyl, and cyclohexyl meth- and ethacrylates; alpha-substituted acrylic acids and esters thereof, e.g., ethyl $\alpha$-chloroacrylate, ethyl $\alpha$-cyanoacrylate, those vinyl components wherein the vinyl group is in the non-acid portion of the molecule, vinyl esters, e.g., vinyl acetate, vinyl chloroacetate, vinyl trimethylacetate, vinyl propionate, and vinyl benzoate; vinyl hydrocarbons, e.g., the vinyl aryls, e.g., styrene; vinylidene halides, such as vinylidene chloride. The just described monomers and mixtures of two or more monomers are liquids which boil above room temperature and should be chosen to give coherent, mechanically strong polymeric printing reliefs when used for such purposes. Of these monomers, because of their relatively high rates of photoinitiated polymerization, the vinyl esters and/or esters of acrylic and alpha-substituted acrylic acids with solely hydrocarbon monoalcohols of no more than six carbons and particularly the lower alkanols of one to four carbon atoms, are preferred. Vinyl esters and the alkyl hydrocarbon substituted acrylic acids and esters wherein the alkyl groups contain one to four carbon atoms are particularly preferred.

For use in the preparation of printing reliefs by the process of U.S. Patent 2,760,863, the preferred polymerizable components not only contain the requisite polymerizable ethylenic linkage in terminal positions, i.e., are vinylidene compounds, but also the photopolymerizable elements contain a photopolymerizable layer containing appreciable proportions of ethylenically unsaturated polymerizable materials containing a plurality of said polymerizable linkages per molecule. These types of monomers are conventionally referred to as crosslinking agents.

This crosslinking facility can be incorporated in the photopolymerizable layer through the use of polymers containing the indicated plurality of polymerizable unsaturated linkages in which instance such materials serve a dual function of both increasing the viscosity of the photopolymerizable layer to the desired level and making available the desired crosslinking facility for the photopolymerization.

Particularly outstanding because of the remarkably improved photographic speed obtained in such compositions by use of the aforesaid-described chain transfer agent are those systems wherein the polymerizable component comprises one or more acrylic or $\alpha$-lower alkylacrylic acids or the $\alpha$-haloacrylic acids and/or the nitriles, amides, including hydrocarbon amides, and hydrocarbyl esters thereof, all of which are directly hydrolyzable thereto.

The chain transfer agents useful in the present invention include generically organic compounds containing combined oxygen and/or sulfur atoms present either as hydroxy oxygen, ether oxygen, mercaptosulfur, or thioether, and inclusive of oxocarbonyl and thiocarbonyl substituents reacting in the tautomeric hydroxyoxy and mercaptosulfur forms. The chain transfer agents, other than these substituents, should be free of any Zerewitinoff-active hydrogen and free of any carbon-to-carbon unsaturation activated by conjugation with any reactive center. Thus, the chain transfer agents include alcohols, glycols, glycol ethers, polyethers containing both terminal oxyhydroxy and oxyether substituents, thiols, dithiols, polythiols, sulfides, polysulfides, ureas, thioureas, and N,N'-substituted ureas and thioureas. Particularly outstanding of these are the polyethers, the alcohols and glycols, including the ethers thereof, and the thioureas, especially the latter.

Suitable specific examples of these chain transfer agents in addition to those given in the foregoing more detailed disclosures include: aliphatic, cycloaliphatic, araliphatic alcohols, e.g., ethyl alcohol, cyclohexanol, $\beta$-phenylethyl alcohol, and the like; aliphatic, cycloaliphatic, araliphatic, and aromatic mercaptans and thioethers, e.g., n-butyl mercaptan, dicyclohexyl disulfide, phenyl mercaptan, dibenzyl sulfide, and the like; aliphatic glycols and cycloaliphatic, aromatic, and alkaromatic substituted aliphatic glycols and aliphatic, cycloaliphatic, aromatic, and alkaromatic ethers thereof, e.g., tetramethylene glycol, i.e., 1,4-dihydroxybutane and the mono- and dimethyl, -phenyl, and -tolyl ethers thereof; polypropylene glycol and the mono- and dimethyl, -cyclohexyl, -phenyl, and -tolyl ethers thereof; the aliphatic, cycloaliphatic, aromatic, and alkaromatic esters and ether esters of aliphatic glycols and the cycloaliphatic, aromatic, and alkaromatic derivatives thereof, e.g., polypropylene glycol, diacetate, and the like; thioureas, including the N-, N,N-, N,N'-, N,N,N'-, N,N',N'-mono-, -di-, and -tri-substituted aliphatic, cycloaliphatic, aromatic, alkaromatic, and araliphatic substituted thioureas, such as N-ethyl thiourea, N,N-diethyl thiourea, N,N'-dipropyl thiourea, N,N,N'-triethyl thiourea, N,N'-diphenyl thiourea, N-ethyl-N-methyl-N'-cyclohexyl thiourea, N,N'-ditolyl thiourea, N-cyclohexyl-N'-phenyl thiourea, N,N'-diallyl thiourea, N-ethyl-N'-allyl thiourea, N-allyl-N'-benzyl thiourea.

For reasons of greater activity, even at low concentration, and thereby improved photographic speed in the compositions based thereon, the thioureas constitute a preferred species, and of these the most desirable, because of readier availability, are those wherein any N-substituents are the same. Those carrying at least one alkenyl and especially at least one allyl substituent are particularly outstanding.

For reasons of solubility in or compatibility with the photopolymerizable compositions, the preferred chain transfer agents will have a carbon to heteroatom ratio not greater than about 10:1. In determining such a ratio, acyclic carbons are counted on a unit basis; whereas, cyclic carbon, i.e., carbon of a carbocyclic or heterocyclic ring, is counted as less than one, with the most conventional six-membered ring counting as about 3–4 carbons. Because of readier availability and to some extent greater compatibility with the photopolymerizable compositions, the most preferred chain transfer agents, in addition to the above properties, also contain no substituent groups having greater than about eight carbons per group.

In the preferred solid compositions of the present invention, especially when used in the preparation of printing plates by the photopolymerization methods of U.S. Patent 2,760,863, various binder materials or fillers may be present, such as are disclosed in that patent and in assignee's U.S. patent applications of Saner, Ser. No. 577,829, filed April 12, 1956, Solvent-Soluble Polyamides; Martin, Ser. No. 538,277, filed October 3, 1955,, now U.S. Patent 2,892,716, issued June 30, 1959, and Ser. No. 461,291, filed October 8, 1954, now U.S. Patent 2,929,710, issued March 26, 1960, Polyvinyl Acetals; Martin and Barney, Ser. No. 596,766, filed July 9, 1956, now U.S. Patent 2,927,022, issued March 1, 1960, Cellulose Acetate Hydrogen Dicarboxylate Esters; Martin, Ser. No. 604,006, filed August 14, 1956, now U.S. Patent 2,902,365, issued September 1, 1959, Base-Soluble Polyvinyl Alcohol Derivatives; Martin, Ser. No. 606,505, filed August 27, 1956, now U.S. Patent 2,927,023, issued March 1, 1960, Water-Soluble Polyvinyl Alcohols; Martin, Ser. No. 606,517, filed August 27, 1956, now abandoned, Water-Soluble Cellulose Derivatives. Binder materials which are compatible with the polymerizable component will be chosen, of course. By compatibility is meant the ability of two or more constituents to remain homogeneously dispersed in one another. Some haze of the composition before or during exposure can be tolerated but in the case of fine detail is preferably avoided.

In addition to the aforesaid components or mixtures thereof, the photopolymerizable layer, as stated above, can also contain added preformed compatible condensation or addition polymers as well as immiscible polymeric or non-polymeric, organic or inorganic fillers or reinforcing agents which are essentially transparent, e.g., the organophilic silicas, the bentonites, silica, and powdered glass, having a particle size less than 0.4 mil in their maximum dimension, and in amounts varying with the desired properties of the photopolymerizable layer.

Suitable preformed compatible polymers include the addition polymers generally, including specifically vinyl ester polymers and copolymers, e.g., polyvinyl acetate, polyvinyl butyrate and hydrolyzed derivatives thereof; polyvinyl acetals, e.g., polyvinyl butyral, formal and hydrolyzed derivatives thereof; and the ilke. Suitable compatible condensation polymers include both saturated and unsaturated types, such as the nylons, the alkyd polymers, e.g., polyglycerol phthalate and polyglyecrol maleate. Other suitable polymers include cellulose derivatives such as esters and ethers, e.g., cellulose acetate, cellulose hydrogen succinate and ethyl cellulose. The addition polymers can also be unsaturated, e.g., unsaturated polyvinyl alcohol esters or acetals, such as polyvinyl sorbate and polyvinyl sorbal.

These added substituents can be present in all the foregoing compositions in order to modify the rheological properties thereof, render the photopolymerizable layers even more tack-free, and make the compositions more readily formable into sheets. Since a stiff sheet can be more easily handled in many forming operations, e.g., in preparing a photopolymerizable plate for use in making a printing plate, the use of filler materials such as the foregoing giving the requisite stiffness has important commercial advantages. Mixtures of two, three, or more of the foregoing compatible polymers and/or fillers can be used in the photopolymerizable compositions, but in general the compatible polymers and fillers should not be present in amounts exceeding about 90% by weight of the whole composition.

Inert, relatively non-volatile, liquid or semi-liquid plasticizers can be present and are particularly efficacious when the compositions per se are too stiff, or when relatively low amounts of the low molecular weight polymerizable component, e.g., 10–15% by weight of the whole, are present.

Most of the low molecular weight polymerizable components discussed previously, including both the mono- and polyethylenically unsaturated compounds, will normally contain, as obtained commercially, minor amounts (about 50–100 parts per million by weight) of polymerization inhibitors so as to prevent spontaneous polymerization before desired. The presence of these inhibitors, which are usually of the antioxidant type, e.g., hydroquinone, tertiary butyl catechols, and the like, in such amounts causes no undesirable results in the photopolymerizable layers of this invention either as to speed or quality of polymerization. In fact, larger quantities of such inhibitors, e.g., of the order of 200–500 parts per million, can easily be tolerated and may be advantageous in tending to reduce unwanted polymerization in non-exposed, non-image areas.

The photopolymerizable compositions of this invention are also suitable for other purpose in which readily insolubilized, solid, addition polymerizable compositions are useful, such as in binders for television phosphors and in producing ornamental effects, and plastic articles of various types. They are useful in making multicolored screens by the photopolymerization procedures described in the copending application of Swindells U.S. appln. Ser. No. 373,753, filed August 12, 1953, now abandoned.

Development, i.e., preferential dissolution of the unexposed areas of the photopolymerizable compositions obtained by any of the foregoing controlled exposure techniques, will normally be carried out in a suitable solvent generally at temperatures of 25–50° C. Higher temperatures, e.g., of the order of 50–60° C. or so, result in rapid development. Development is frequently accelerated by brushing or scrubbing. In large scale work, application of the solvent will advantageously be carried out by means of jets or sprays. Solvents include the short chain aliphatic alcohols, short chain aliphatic and cycloaliphatic ketones, as well as the low molecular weight halogenated hydrocarbons such as methanol, ethanol, acetone, methylene chloride, and mixtures of such solvents. Water also can be a suitable solvent alone or in admixture with the above water-miscible solvents. Aqueous alkaline solutions also are useful. Surface-active wetting agents (surfactants) can also be used.

An advantage of this invention is that it enables one to improve the speed of photopolymerizable compositions containing the polynuclear quinones as initiators by the simple and dependable expedient of adding a chain transfer agent. Another advantage is that by increasing the speed of such photopolymerizable compositions, one can more rapidly convert photopolymerizable elements bearing layers of such compositions to printing reliefs. Since the polynuclear quinones are relatively inexpensive and are readily available in commerce, the invention has the economic advantage of increasing the speed of compositions containing addition polymerizable ethylenically unsaturated compounds free from high chain transfer activity by addition of an inexpensive chain transfer agent.

The printing reliefs made in accordance with this invention can be used in all classes of printing, but are most applicable to those classes wherein a distinct difference in height between printing and non-printing areas is required. These classes include: those wherein the ink is carried by the raised portion of the relief, such as in dry offset printing; ordinary letterpress printing (the latter requiring greater height differences between printing and non-printing areas); and those wherein the ink is carried by the recessed portions of the relief, such as in intaglio printing, e.g., line and inverted halftone. The plates are obviously useful for multicolor printing. This invention also includes photopolymerizable elements suitable for the preparation of printing relief images, as above, which comprise layers of the composition of this invention superposed on an adherent support, which in the case of the solid compositions of adequate physical properties can be a further thickness of said composition, said layer being from 3–250 mils in thickness, all as described in greater detail in U.S. Patent 2,760,863.

We claim:

1. A photopolymerizable composition comprising (1) 0.0001 to 2.0% by weight of a polynuclear quinone having two intracyclic carbonyl groups attached to intracyclic carbon atoms in a conjugated six-membered ring, there being at least one aromatic carbocyclic ring fused to the ring containing said carbonyl groups, said quinone being free from aromatic nitro, amino and hydroxyl groups, and having essentially no chain transfer activity and any such activity being less than that of the polymerizable component (3), (2) a chain transfer agent of addition polymerization having a transfer constant between 0.0005 and 1.0 when measured at 60° C. against polymerizing vinyl acetate monomer in a liquid, oxygen-free system under autogenous pressure comprising the transfer agent and a free-radical-generating addition polymerization initiator in solution in the monomer, said constituent (2) being present in an amount from 0.01% up to equal parts by weight of constituent (3), and (3) at least one normally non-gaseous addition polymerizable ethylenically unsaturated compound free from oxyhydroxy ether, and the corresponding mercapto and thioether groups having at least one terminal ethylenic group, having a molecular weight less than 1500 and a boiling point above 100° C. at atmospheric pressure, being capable of forming a high polymer by free-radical initiated chain-propagating addition polymerization in the presence of an addition polymerization initiator therefor activatable by actinic radiation, and having a transfer constant no greater than 0.0005, said constituent (3) being the only type of addition polymerizable ethylenically unsaturated compound in the composition.

2. A composition as set forth in claim 1 wherein said chain transfer agent contains at least one group taken from the class consisting of ether, oxyhydroxy, thioether and mercapto groups.

3. A composition as set forth in claim 1 wherein said chain transfer agent is a polyalkylene glycol having a molecular weight of at least 200.

4. A composition as set forth in claim 1 wherein said polynuclear quinone is a 9,10-anthraquinone free from aromatic nitro, amino, and hydroxyl groups.

5. A photopolymerizable element comprising a support bearing a photopolymerizable layer comprising (1) 0.0001 to 2.0% by weight of a polynuclear quinone having two intracyclic carbonyl groups attached to intracyclic carbon atoms in a conjugated six-membered ring, there being at least one aromatic carbocyclic ring fused to the ring containing said carbonyl groups, said quinone being free from aromatic nitro, amino and hydroxyl groups, said constituent (1) having essentially no chain transfer activity and any such activity being less than that of the polymerizable component (3), (2) a chain transfer agent of addition polymerization having a transfer constant between 0.0005 and 1.0 when measured at 60° C. against polymerizing vinyl acetate monomer in a liquid, oxygen-free system under autogenous pressure comprising the transfer agent and a free-radical-generating addition polymerization initiator in solution in the monomer, said constituent (2) being present in an amount from 0.01% up to equal parts by weight of constituent (3), and (3) at least one normally non-gaseous addition polymerizable ethylenically unsaturated compound free from oxyhydroxy, ether, and the corresponding mercapto and thioether groups having at least one terminal ethylenic group, having a molecular weight less than 1500 and a boiling point above 100° C. at atmospheric pressure, being capable of forming a high polymer by free-radical initiated chain-propagating addition polymerization in the presence of an addition polymerization initiator therefor activatable by actinic radiation, and having a transfer constant no greater than 0.0005, said constituent (3) being the only type of addition polymerizable ethylenically unsaturated compound in the composition.

6. An element as set forth in claim 5 having antihalation material beneath the photopolymerizable layer.

7. An element as set forth in claim 6 wherein said support is a metal sheet.

8. A process for making a printing relief which comprises exposing to actinic light selected portions of the photopolymerizable layer of the element defined in claim 5 until substantial addition polymerization to the insoluble state occurs in the exposed areas of said layer with substantially no polymerization in the unexposed portions of the layer and removing said latter portions with a solvent therefor.

9. A process as set forth in claim 8 wherein said exposure is through an image-containing element having actinic light-opaque areas and actinic light-transparent areas which latter are each of the same optical density.

References Cited in the file of this patent

UNITED STATES PATENTS

| | | |
|---|---|---|
| 2,760,863 | Plambeck | Aug. 28, 1956 |
| 2,892,716 | Martin | June 30, 1959 |
| 2,951,758 | Notley | Sept. 6, 1960 |
| 2,989,455 | Neugebauer et al. | June 20, 1961 |

FOREIGN PATENTS

| | | |
|---|---|---|
| 717,708 | Great Britain | Nov. 3, 1954 |

OTHER REFERENCES

Stevens: Society of Chemical Industry Journal, London, vol. 64, 1945, pages 135–138. (Copy in Sci. Libr.)